(12) United States Patent
Nazarian

(10) Patent No.: US 8,320,160 B2
(45) Date of Patent: Nov. 27, 2012

(54) NAND ARCHITECTURE HAVING A RESISTIVE MEMORY CELL CONNECTED TO A CONTROL GATE OF A FIELD-EFFECT TRANSISTOR

(75) Inventor: Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 57 days.

(21) Appl. No.: 13/051,296

(22) Filed: Mar. 18, 2011

(65) Prior Publication Data
US 2012/0236650 A1 Sep. 20, 2012

(51) Int. Cl.
*G11C 11/40* (2006.01)
(52) U.S. Cl. ............ 365/148; 365/163; 365/185.17
(58) Field of Classification Search ............ 365/185.17, 365/148, 158, 163
See application file for complete search history.

(56) References Cited

U.S. PATENT DOCUMENTS

| | | | |
|---|---|---|---|
| 5,499,208 A | 3/1996 | Shoji | |
| 5,673,223 A * | 9/1997 | Park | 365/185.17 |
| 5,923,587 A * | 7/1999 | Choi | 365/185.11 |
| 6,897,519 B1 | 5/2005 | Dosluoglu | |
| 7,251,152 B2 * | 7/2007 | Roehr | 365/100 |
| 7,561,461 B2 | 7/2009 | Nagai et al. | |
| 7,746,696 B1 | 6/2010 | Paak | |
| 7,764,536 B2 | 7/2010 | Luo et al. | |
| 8,243,542 B2 | 8/2012 | Bae et al. | |
| 2009/0251941 A1 | 10/2009 | Saito | |
| 2010/0067279 A1 | 3/2010 | Choi | |
| 2010/0102290 A1 | 4/2010 | Lu et al. | |
| 2010/0171086 A1 | 7/2010 | Lung et al. | |
| 2010/0182821 A1 | 7/2010 | Muraoka et al. | |
| 2011/0066878 A1 | 3/2011 | Hosono et al. | |
| 2012/0074507 A1 * | 3/2012 | Jo et al. | 257/379 |

OTHER PUBLICATIONS

Office Action and List of References for U.S. Appl. No. 12/815,318 dated May 16, 2012 from the United States Patent and Trademark Office.
International Search Report for PCT/US2011/046036 filed on Jul. 29, 2011.
Written Opinion of the International Searching Authority for PCT/US2011/046036 filed on Jul. 29, 2011.
Office Action for U.S. Appl. No. 12/900,232 dated Jul. 30, 2012.
Notice of Allowance for U.S. Appl. No. 12/900,232 dated Sep. 18, 2012.

* cited by examiner

*Primary Examiner* — Andrew Q Tran
(74) *Attorney, Agent, or Firm* — Ogawa P.C.

(57) ABSTRACT

A non-volatile memory device includes a first select transistor, a second select transistor, and a first string of first memory cells provided between the first and second select transistors. Each first memory cell has a first resistive memory cell and a first transistor. The first resistive memory cell is in series with a gate of the first transistor. The non-volatile memory device further includes a first bit line coupled to a drain of the first select transistor and a plurality of word lines. Each word line is coupled to one of the first memory cells.

26 Claims, 10 Drawing Sheets

<PRIOR ART>

NAND ARCHITECTURE HAVING A RESISTIVE MEMORY CELL CONNECTED TO A CONTROL GATE OF A FIELD-EFFECT TRANSISTOR

CROSS-REFERENCES TO RELATED APPLICATIONS

Not Applicable

BACKGROUND OF THE INVENTION

The present invention relates to a NAND memory architecture including resistive memory cells.

Resistive random-access memories (RRAMs) are a type of resistive memory that has generated significant interest recently as a potential candidate for ultra-high density non-volatile information storage. A typical RRAM device has an insulator layer provided between a pair of electrodes and exhibits electrical pulse-induced hysteretic resistance switching effects.

The resistance switching has been explained by the formation of conductive filaments inside the insulator due to Joule heating and electrochemical processes in binary oxides (e.g., NiO and $TiO_2$) or by redox processes for ionic conductors including oxides, chalcogenides, and polymers. The resistance switching has also been explained by field-assisted diffusion of ions in $TiO_2$ and amorphous silicon (a-Si) films.

In the case of a-Si structures, electric field-induced diffusion of metal ions into the silicon leads to the formation of conductive filaments that reduce the resistance of the a-Si structure. These filaments remain after a biasing (or program) voltage is removed, thereby giving the device its non-volatile characteristic, and the filaments can be removed by reversing the flow of the ions back toward the metal electrode under the motive force of a reverse polarity applied voltage.

Resistive devices based on an a-Si structure, particularly those that are formed on polysilicon, typically exhibit good endurance or life cycle. However, the endurance of the resistive device can be shortened if excessive bias voltage is applied during the repeated write and erase cycles, in part due to Joule heating and to movements of an unnecessarily large number of metal ions in the a-Si structure. Furthermore, in general, RRAM device yield is affected by the electroforming process, during which a major part of the conducting path is formed inside the insulating switching layer by applying a larger voltage (or current) signal to the device.

BRIEF SUMMARY OF THE INVENTION

The present invention relates to a NAND memory architecture including resistive memory cells.

In an embodiment, a non-volatile memory device includes a first select transistor; a second select transistor; a first string of first memory cells provided between the first and second select transistors, each first memory cell having a first resistive memory cell and a first transistor, the first resistive memory cell being in series with a gate of the first transistor; a first bit line coupled to a drain of the first select transistor; and a plurality of word lines, each word line being coupled to one of the first memory cells.

In an embodiment, the non-volatile memory device further includes a drain select line coupled to a gate of the first select transistor; and a source select line coupled to a gate of the second select transistor.

In an embodiment, the resistive memory device is a two-terminal switching device. The resistive memory device includes two electrodes and a switching medium provided therebetweeen. The switching medium includes amorphous silicon.

In an embodiment, the non-volatile memory device further includes a third select transistor; a fourth select transistor; a second string of memory cells provided between the third and fourth select transistors, each second memory cell having a second resistive memory cell and a second transistor, the second resistive memory cell being in series with a gate of the second transistor; and a second bit line coupled to a drain of the third select transistor. Each of the plurality of word lines is coupled to one of the second memory cells.

In an embodiment, the non-volatile memory device is a NAND flash memory device.

In an embodiment, each resistive memory cell includes a first electrode, a switching medium, and a second electrode. Each transistor includes a gate electrode, a gate oxide, a source region, a drain region and a channel between the source and drain regions.

In an embodiment, the second electrode of the resistive memory cell and the gate electrode of the transistor are in contact with each other.

In an embodiment, the second electrode of the resistive memory cell and the gate electrode of the transistor share the same conductive structure. In an embodiment, the same conductive structure includes a polysilicon layer.

In an embodiment, the first electrode includes silver and the switching medium including amorphous silicon.

In an embodiment, the gate oxide has a thickness of 50 Å or less, or 20-30 Å, or 20 Å or less.

In another embodiment, a non-volatile memory device includes a first string of first memory cells, each first memory cell having a first resistive memory cell and a first transistor, the first resistive memory cell being in series with a gate of the first transistor; a first bit line coupled to the first string; a second string of second memory cells, each second memory cell having a second resistive memory cell and a second transistor, the second resistive memory cell being in series with a gate of the second transistor; a second bit line coupled to the second sting; and a plurality of word lines, each word line being coupled to one of the first memory cells in the first string and one of the second memory cells in the second string.

In another embodiment, each resistive memory cell is connected in series to a gate of the corresponding transistor.

In another embodiment, each resistive memory cell includes a first electrode, a switching medium, and a second electrode, wherein each transistor includes a gate electrode, a gate oxide, a source region, a drain region and a channel, and wherein the second electrode and the gate electrode share a conductive material.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to a NAND memory architecture including resistive memory cells.

Figure 1:
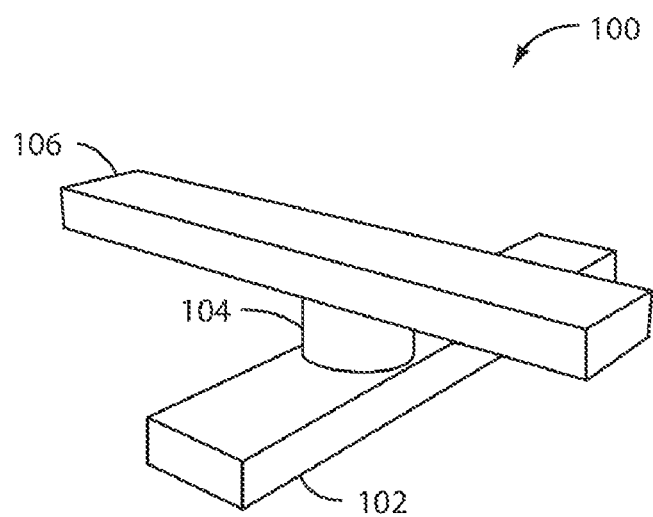
FIG. 1 illustrates a non-volatile memory device including a memory cell that has a bottom electrode, a switching medium, and a top electrode according to an embodiment of the present invention.

FIG. 1 illustrates a memory cell 100 in a non-volatile memory device, e.g., a semiconductor memory chip. The memory cell includes a bottom electrode 102, a switching medium 104, and a top electrode 106 according an embodiment of the present invention. The switching medium 104 exhibits a resistance that can be selectively set to various values and reset using appropriate control circuitry. The memory cell 100 is a two-terminal resistive memory device, e.g., resistive random-access memory (RRAM), in the present embodiment. In the present embodiment, the memory cell 100 is used as part of a memory cell in a NAND architecture. As will be appreciated by one skilled in art, the memory cell 100 may also be used as other types of devices, such as a programmable variable capacitor.

A resistive memory cell is a two-terminal memory cell having a switching medium provided between top and bottom electrodes. The resistance of the switching medium can be controlled by applying an electrical signal to the electrodes. The electrical signal may be current-based or voltage-based. As used herein, the term "RRAM" or "resistive memory cell" refers to a memory cell or memory device that uses a switching medium whose resistance can be controlled by applying an electrical signal without ferroelectricity, magnetization, and phase change of the switching medium.

In the present embodiment, the memory cell 100 is an amorphous-silicon-based resistive memory cell and uses amorphous silicon (a-Si) as the switching medium 104. The resistance of the switching medium 104 changes according to formation or retrieval of a conductive filament inside the switching medium 104 according to a voltage applied to the electrodes. In an embodiment, the switching medium 104 is substantially free of dopants. The top electrode 106 is a conductive layer containing silver (Ag) and acts as the source of filament-forming ions in the a-Si structure. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). The bottom electrode 102 is a boron-doped electrode, or other p-type polysilicon, that is in contact with a lower-end face of the a-Si structure. In an embodiment, the memory cell 100 is configured to store more than a single bit of information, e.g., by adjusting the external circuit resistance, as explained in application Ser. No. 12/575, 921, filed on Oct. 9, 2009, which is entitled "Silicon-Based Nanoscale Resistive Device with Adjustable Resistance" and is incorporated by reference in its entirety.

Figure 2A:
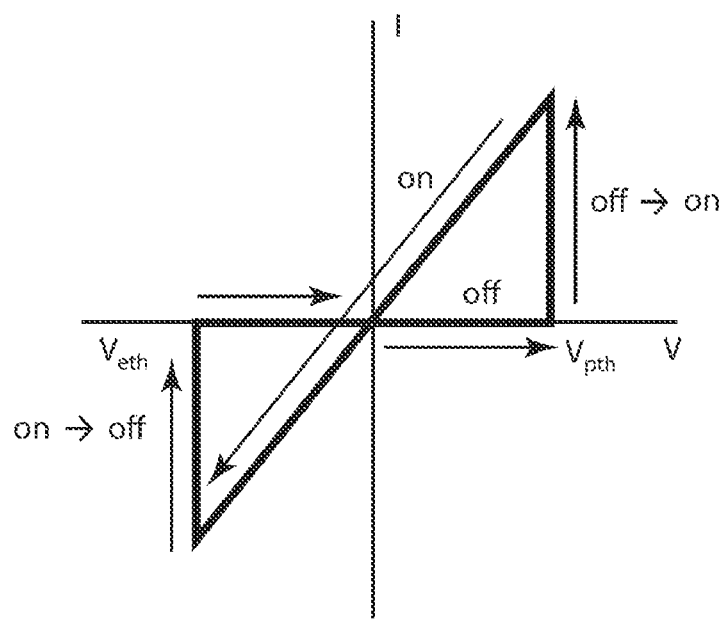
FIG. 2A illustrates resistance switching characteristics of a resistive memory cell according to an embodiment of the present invention.

FIG. 2A illustrates resistance switching characteristics of the memory cell 100 according to an embodiment of the present invention. The switching medium 104 displays a bipolar switching mechanism. The resistance of the switching medium 104 changes depending on the polarity and magnitude of the current signal applied to the switching medium 104 via the top electrode 106 and the bottom electrodes 102. The memory cell 100 is changed into an ON state (low resistance state) when a positive voltage equal to or greater than a program threshold voltage (or program voltage) $V_{pth}$ is applied. In an embodiment, the program voltage ranges between 2 volts to 5 volts depending on the materials used for the switching medium 104 and the top electrode 106. The memory cell 100 is switched back to an OFF state (high resistance state) when a negative voltage equal to or greater than an erase threshold voltage (or erase voltage) $V_{eth}$ is applied. In an embodiment, the erase voltage ranges from −2 volts to −5 volts. The cell state is not affected if the voltage applied is between two threshold voltages $V_{pth}$ and $V_{eth}$, which enables a low-voltage read process. Once the memory cell 100 is set to a specific resistance state, the memory cell 100 retains the information for a certain period (or retention time) without electrical power.

FIG. 2A illustrates non-rectifying switching characteristics of the memory cell 100 according to an embodiment of the present invention. Electrical current flows from the top electrode 106 to the bottom electrode 102 when the potential applied to the top electrode 106 is positive potential with respect to the bottom electrode 102. On the other hand, the current flows in the reverse direction if the potential applied to the top electrode 106 is negative with respect to the bottom electrode 102.

Figure 2B:
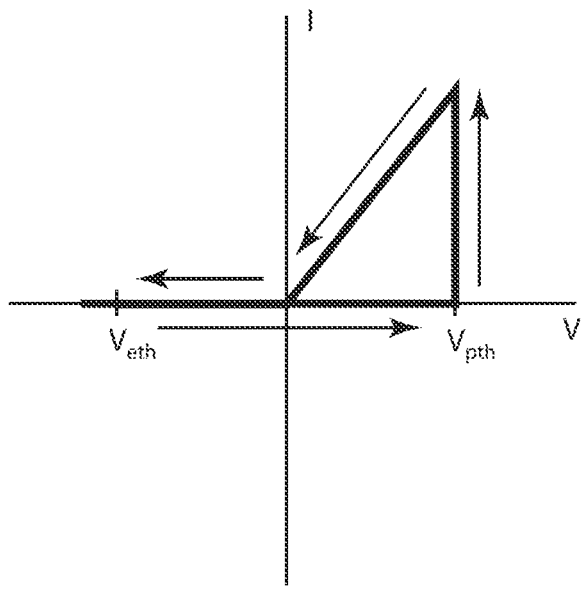
FIG. 2B illustrates resistance switching characteristics of a resistive memory cell according to an embodiment of the present invention.

FIG. 2B, on the other hand, illustrates rectifying switching characteristics of the memory cell 100 according to another embodiment of the present invention. Electrical current flows from the top electrode 106 to the bottom electrode 102 when the top electrode 106 is applied with a positive potential with respect to the bottom electrode 102. However, the current does not flow in the reverse direction, even if the top electrode 106 is applied with a negative potential with respect to the bottom electrode 102. Under this embodiment, the memory cell 100 exhibits a diode-like behavior and can be represented with an equivalent circuit including a resistor connected in series with a diode. The memory cell 100 can be controlled to exhibit either rectifying or non-rectifying characteristics by controlling the amount of current flowing through the memory cell, as will be explained in more detail later.

Figure 3A:
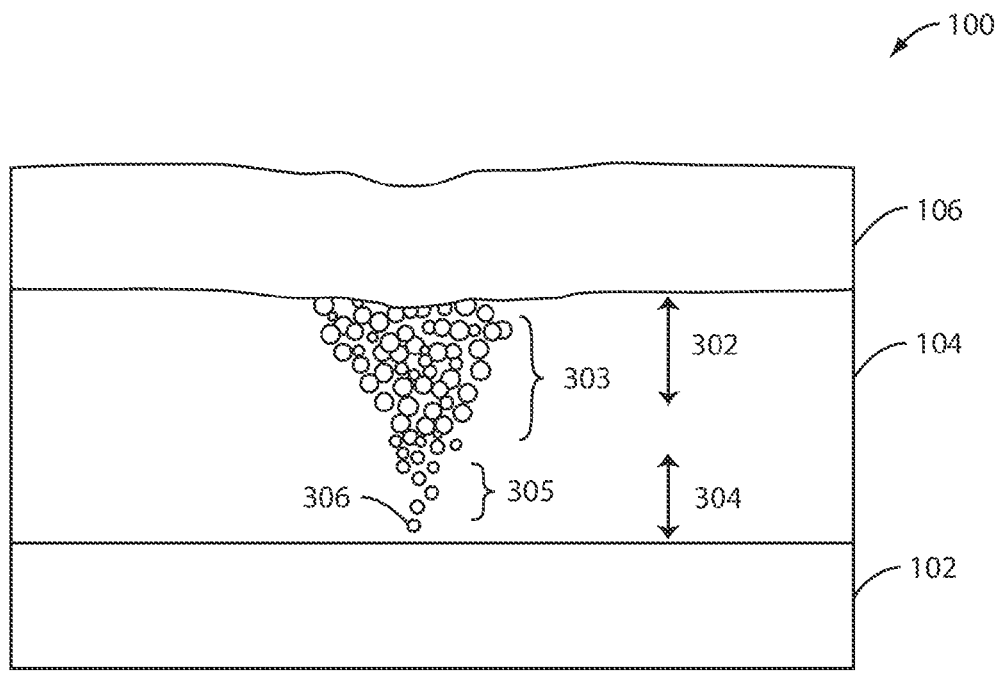
FIG. 3A illustrates a two-terminal memory cell that is placed in an ON state by applying a program voltage $V_{pth}$ to the top electrode.
Figure 3B:
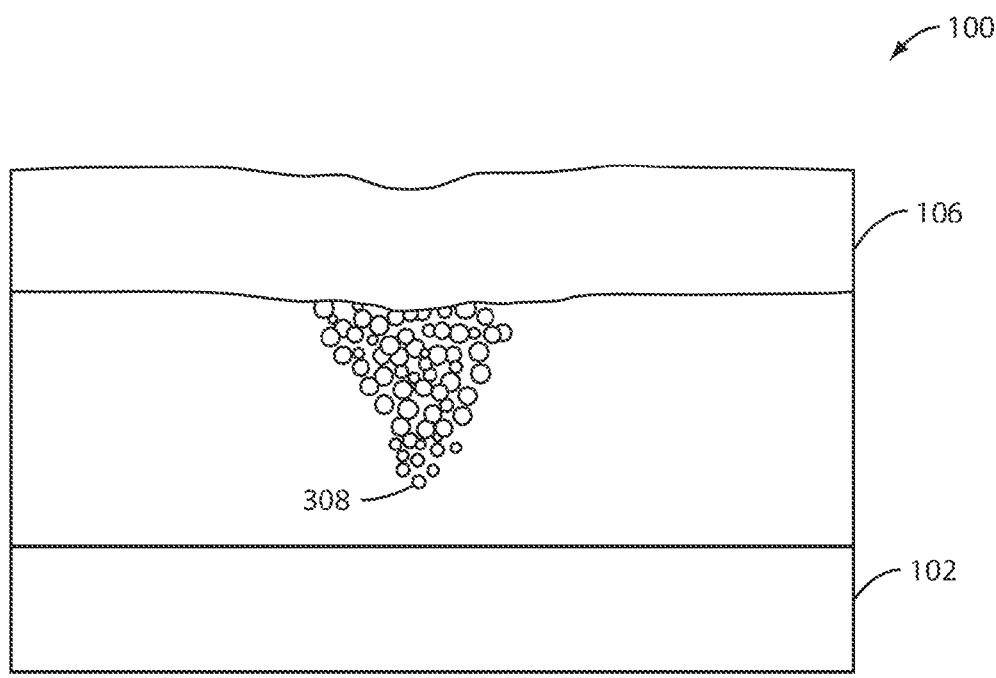
FIG. 3B illustrates a two-terminal memory cell that is placed in an OFF state by applying an erase voltage $V_{eth}$ to the top electrode.

FIGS. 3A and 3B illustrate a switching mechanism of the memory cell 100 during the ON and OFF states according to an embodiment of the present invention. The switching in the switching medium 104 is based on formation and retrieval of a conductive filament, or a plurality of filaments, in a filament region in the switching medium 104 according to the program and the erase voltages applied to the bottom electrode 102 and the top electrode 106 of the memory cell 100.

FIG. 3A illustrates the memory cell 100 that is placed in an ON state by applying the program voltage $V_{pth}$ to the top electrode 106. The switching medium 104, made of a-Si, is provided between the bottom electrode 102 and the top electrode 106. An upper portion of the switching medium 104 includes a metallic region (or conductive path) 302 that extends from the top electrode 106 to approximately 10 nm above the bottom electrode 102. The metallic region 302 is formed during an electroforming process when a slightly larger voltage than a subsequent switching voltage, e.g., 3~5 V, is applied to the top electrode 106. This large voltage causes the electric field-induced diffusion of the metal ions from the top electrode 106 toward the bottom electrode 102, thereby forming a continuous conductive path 303. A lower portion of the switching medium 104 defines a filament region 304, wherein the filament 305 is formed when the program voltage $V_{pth}$ is applied after the electroforming process. The continuous conductive path 303 and the filament 305 can also be formed together during the electroforming process. The filament 305 comprises a series of metal particles, which are trapped in defect sites in a lower portion of the switching medium 104 when the program voltage $V_{pth}$ applied provides sufficient activation energy to push a number of metal ions from the metallic region 302 toward the bottom electrode 102.

The filament 305 is believed to be comprised of a collection of metal particles that are separated from each other by the non-conducting switching medium 104 and that do not define a continuous conductive path, unlike the continuous conductive path 303 in the metallic region 302. The filament 305 extends about 2 to 10 nm depending on implementation. The conduction mechanism in an ON state is electrons tunneling through the metal particles in the filament 305. The cell resistance is dominated by the tunneling resistance between the metal particle 306 and the bottom electrode 102. The metal particle 306 is a metal particle in the filament region 304 that is closest to the bottom electrode 102 and that is the last metal particle in the filament region 304 in an ON state.

FIG. 3B illustrates the memory cell 100 that is placed in an OFF state by applying an erase voltage $V_{eth}$ to the top electrode 106. The erase voltage exerts sufficient electromagnetic force to dislodge the metal particles trapped in the defects sites of the a-Si and retrieves at least part of the filament 305 from the filament region 304. The metal particle 308 that is closest to the bottom electrode 102 in an OFF state is separated from the bottom electrode 102 by a distance greater than the metal particle 306 during an ON state. This increased distance between the metal particle 308 and the bottom electrode 102 places the memory cell 100 in a high resistance state compared to an ON state. In an embodiment, the resistance ratio between ON/OFF states ranges from 10E3 to 10E7. Memory cell 100 behaves like a resistor in an ON state and a capacitor in an OFF state (i.e., the switching medium 104 does not conduct a current in any meaningful amount and behaves as a dielectric in an OFF state). In an implementation, the resistance is 10E5 Ohm in an ON state and 10E10 Ohm in an OFF state. In another implementation, the resistance is 10E4 Ohm in an ON state and 10E9 Ohm in an OFF state. In yet another implementation, the resistance is at least 10E7 Ohm in an OFF state.

In an embodiment, the memory cell 100 exhibits controllable ON-state current flow of 10 nA-10 mA and endurance of greater 10E6. The memory cell 100, however, exhibits a relatively low retention time of 6 years at room temperature. One reason for the low retention time for the memory cell 100 is believed to be the presence of only a small number of the metal particle 306 that are trapped in the defect sites in the filament region 304. With a limited number of the metal particle 306 in the filament region 304, dislodging only a few of the metal particle 306 can significantly increase the resistance of the memory cell 100 and cause the memory cell 100 to switch from an ON state to an OFF state. In order to increase the retention time, the memory cell 100 should be provided with a greater number of the metal particle 306 in the filament region 304 by increasing the number of defect sites in the filament region 304 to trap the metal particle 306 therein.

The memory cell 100, however, has p-type polysilicon as the bottom electrode 102 and amorphous silicon as the switching medium 104. Since the switching medium 104 is formed on the polysilicon bottom electrode 102, the amorphous silicon formed thereon is substantially homogenous and has relatively few defect sites at the interface between a-Si and p-type polysilicon. Fewer defect sites at the interface results in fewer of the metal particles 306 that could be trapped in the filament region 304. Accordingly, even a minor variance in defect site formation can result in a significant change in percentage of available defect sites needed to trap the metal particle 306 in the filament region 304. This can cause the retention time to fluctuate greatly from device to device and from one programmed state to another. Accordingly, it would be desirable to provide the filament region 304 of the switching medium 104 with a higher defect density in order to increase the retention time and to make the retention time more predictable. Defect site formation, however, needs to be controllable so that too many defect sites are not created in the filament region 304, since this would seriously diminish the endurance of programmable variable capacitor 400, as explained in U.S. patent application Ser. No. 12/582,086, filed on Oct. 20, 2009, which is incorporated by reference in its entirety.

Referring back to FIGS. 2A and 2B, the memory cell 100 can be controlled to exhibit a diode-like behavior by controlling the amount of current flowing through the memory cell 100. If the amount of current flowing through the memory cell 100 is less than a threshold amount, the memory cell 100 exhibits a diode-like behavior, thereby preventing a reverse current flow from the bottom electrode 102 to the top electrode 106. In an embodiment, the threshold current is 10 μA so that the memory cell 100 exhibits non-rectifying characteristics (see FIG. 2A) if the amount of current is 10 μA or more and rectifying characteristics (see FIG. 2B) if the amount of current is less than 10 μA. The current threshold varies according to implementation, e.g., the materials used and the size of the cell.

It is believed that a negative potential applied to the bottom electrode 102 causes the metal particle 306 closest to the bottom electrode 102 (see FIG. 3A) to shift slightly upward without dislodging it from the filament region 304. The resulting increased distance between the metal particle 306 and the bottom electrode 102 increases the resistance and prevents the current from flowing from the bottom electrode 102 to the metal particle 306. If the current, however, is equal to or greater than the threshold level, the large current bursts through the metal particle 306 from the bottom electrode.

Figure 4A:
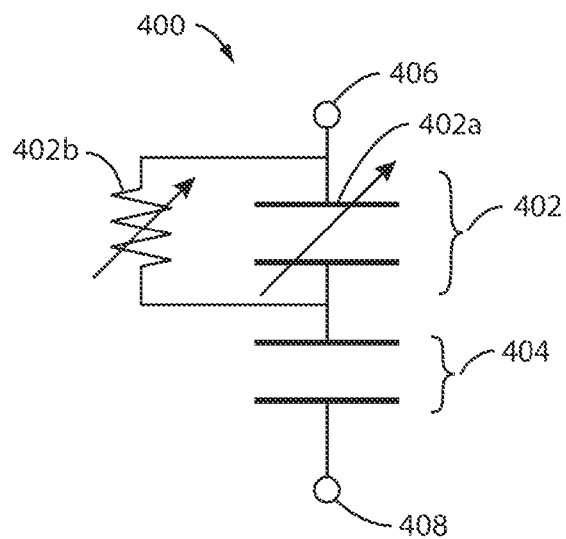
FIG. 4A illustrates an equivalent circuit for a resistive memory cell integrated with a capacitor to define a programmable variable capacitor according to an embodiment of the present invention.

FIG. 4A illustrates an equivalent circuit for a resistive memory cell 402 integrated with a capacitor 404 to define the programmable variable capacitor 400 according to an embodiment of the present invention. The programmable variable capacitor 400 has a stack of two two-terminal devices, the resistive memory cell 402 and the capacitor 404, that are connected between nodes 406 and 408. The bottom electrode of the resistive memory cell 402 is connected in series to the top electrode of the capacitor 404. The resistive memory cell 402 corresponds to the memory cell 100 and is configured to have resistance of no more than 10E4 Ohms in an ON state and greater than 10E8 Ohms in an OFF state in an embodiment. In another embodiment, the resistive memory cell 402 may be configured to have different ON and OFF resistance values according to implementation.

The resistive memory cell 402 in effect behaves as a capacitor in an OFF state and as a resistor in an ON state. The resistive memory cell 402 accordingly is represented by a variable capacitor 402a and a variable resistor 402b. The total capacitance across the nodes 406 and 408 is defined by: $1/C_T=1/C_{402}+1/C_{404}$, where $C_{402}$ refers to the capacitance of the resistive memory cell 402 and $C_{404}$ refers to the capacitance of the capacitor 404. The total capacitance increases when the resistive memory cell 402 is turned ON and decreases when the resistive memory cell 402 is turned OFF. The total capacitance, therefore, can be programmed to have different values by turning the resistive memory cell 402 ON or OFF. This programmed capacitance value may be retained for an extended time period, e.g., 5 to 10 years or more, according to the retention time of the resistive memory cell 402. In an embodiment, the programmable variable capacitor 400 may be programmed to have three or more capacitance values by integrating it with the resistive memory cell 402, which can be placed in three or more resistive states.

Figure 4B:
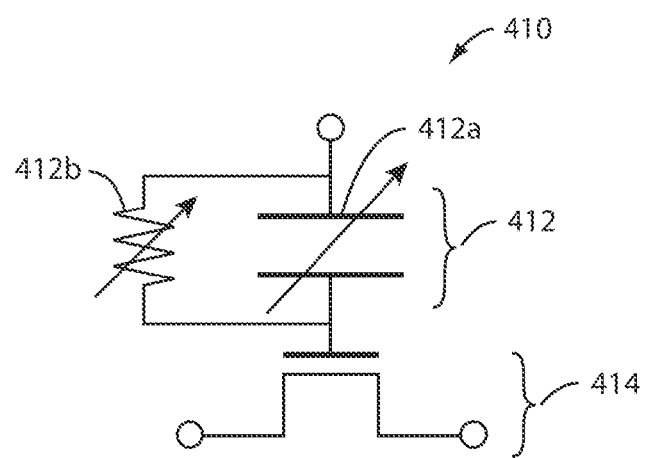
FIG. 4B illustrates an equivalent circuit for a resistive memory cell integrated with a transistor to define a non-volatile memory device according to an embodiment of the present invention.

FIG. 4B illustrates an equivalent circuit for a resistive memory cell integrated with a transistor to define a non-volatile memory device 410 according to an embodiment of the present invention. Non-volatile memory device 410 integrates a resistive memory cell 412 and a transistor 414, e.g., a MOS transistor. The resistive memory cell 412 is represented by a variable capacitor 412a and a variable resistor 412b. The bottom electrode of resistive memory cell 412 is connected in series to the gate electrode of the transistor 414. Resistive memory cell 412 corresponds to the memory cell 100 and is configured to have resistance of no more than 10E4 Ohms in an ON state and greater than 10E8 Ohms in an OFF state in an embodiment. In another embodiment, the resistive memory cell 412 may be configured to have different ON and OFF resistance values according to implementation.

As explained above, the resistive memory cell 412 in effect behaves as a capacitor in an OFF state and as a resistor in an ON state. The total capacitance increases when the resistive memory cell 412 is ON and decreases when the resistive memory cell 412 is OFF. The total capacitance, therefore, can be programmed to have different values by turning the resistive memory cell 412 ON or OFF. The threshold voltage $V_T$ of the resistive memory cell 412 varies as the gate capacitance of the transistor 412 changes.

Figure 5:
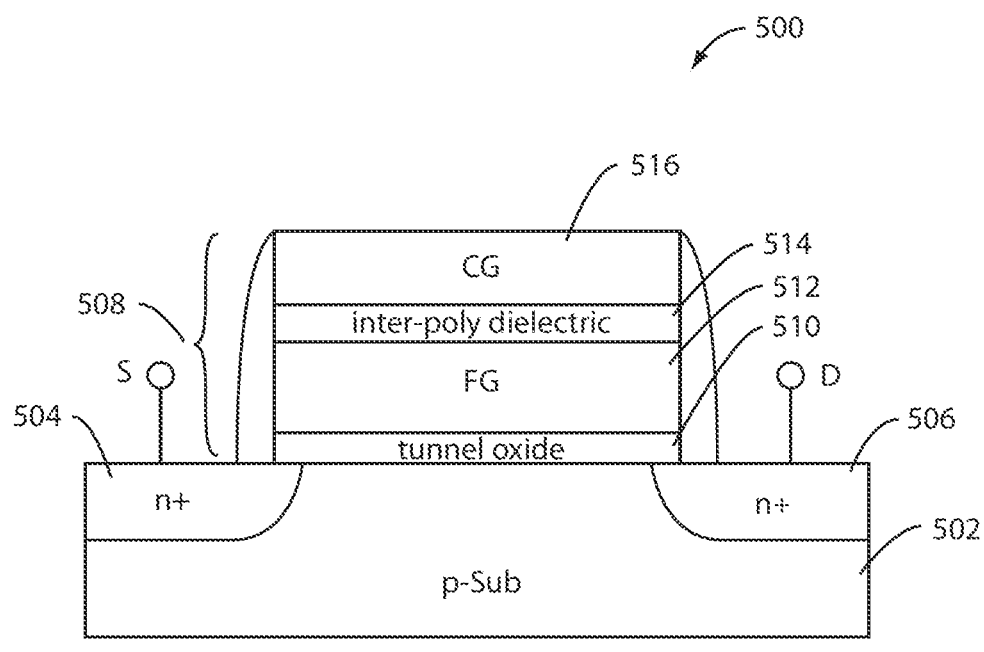
FIG. 5 illustrates a conventional non-volatile memory device.

As illustrated above, a resistive memory cell or RRAM may be implemented into various different programmable devices. Given its small cell size and scalability, resistive memory cells show great promise as ultra-high density non-volatile memory devices. Currently, flash memory is the ultra-high density non-volatile memory device of choice. FIG. 5 illustrates a flash memory cell 500 including a p-type substrate 502, a source region 504, a drain region 506, and a gate structure 508 defined between the source region 504 and the drain region 506. Gate structure 508 includes a tunnel oxide 510, a floating gate 512 made of polysilicon provided over the tunnel oxide 510, an interpoly dielectric layer 514 over the floating gate 512, and a control gate 516 made of polysilicon over the interpoly dielectric layer 514. Flash memory cell 500 uses a single transistor to store a plurality of bits, e.g., logic-0 and logic-1, and has enabled implementation of a highly dense non-volatile memory device to be realized within the past twenty years. One difficulty currently encountered in the continued scaling down of the flash memory cell size has been maintaining the proper thickness of the tunnel oxide 510. The tunnel oxide 510 in the flash memory cell 500 needs to be of a sufficient thickness to properly regulate the tunneling of electrons into and out of the floating gate 512. In the conventional art, tunnel oxide remains at a thickness of about 70 Å or greater. It is currently believed that tunnel oxide cannot properly regulate the tunneling of electrons if its thickness is reduced to approximately 60 Å or less.

Another difficulty in scaling down the size of flash memory cells has been maintaining the height of the gate structure. The gate structure needs to be relatively high, e.g., 150 nm, to provide a surface area that is sufficiently large to achieve the desired coupling ratio between the control gate 516 and the floating gate 512. If the coupling ratio is not sufficiently high, greater program voltage would be needed to program the flash memory cell 500, which would require more power consumption and bigger voltage pumps in the peripheral region of the flash memory.

Figure 6A:
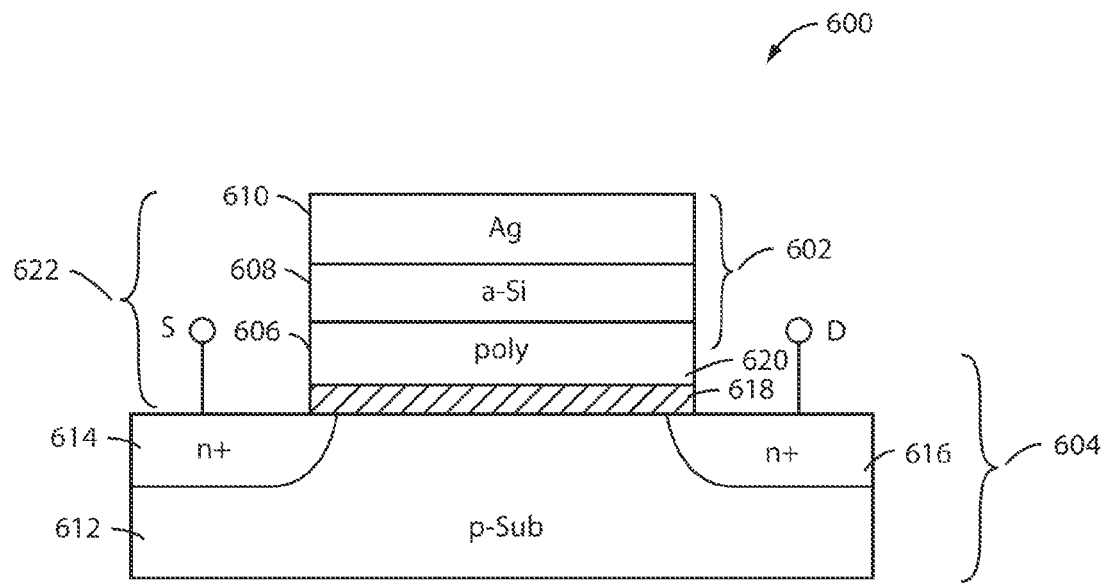
FIG. 6A illustrates a cross-sectional view of a resistive memory cell integrated with a transistor to define a non-volatile memory device according to an embodiment of the present invention.

FIG. 6A illustrates a non-volatile memory device 600 according to an embodiment of the present invention. Non-volatile memory device 600 includes a resistive memory cell 602 and a transistor 604. Non-volatile memory device 600 does not require a tunnel oxide for transistor 604 since the resistive state of the resistive memory cell 602 is used to store information. Non-volatile memory device 600 also does not require a high gate structure since the program voltage for non-volatile memory device 600 does not depend on the coupling ratio between a control gate and a floating gate as in the flash memory cell 500. As will be understood by those skilled in the art, non-volatile memory device 600 is a memory cell in a non-volatile memory device. The terms "device" and "cell" are used interchangeably and should not be limited to one or the other unless its usage is clearly limited to such from the context.

Resistive memory cell 602 includes a bottom electrode 606, a switching medium 608, and a top electrode 610 according, an embodiment. In an embodiment, the bottom electrode 606, the switching medium 608, and the top electrode 610 have thicknesses of 20 nm, 20 nm, and 20 nm, respectively. The switching medium 608 exhibits a resistance that can be selectively set to various values and reset by applying electrical signals to the electrodes. The electrical signal may be current-based or voltage-based.

Resistive memory cell 602 is amorphous-silicon-based RRAM and uses amorphous silicon (a-Si) as the switching medium 608. The resistance of the switching medium 608 changes according to formation or retrieval of a conductive filament (not shown) inside the switching medium 608 according to electrical signals applied.

The top electrode 610 includes silver (Ag) as the source of filament-forming metal ions in the switching medium 608. In an embodiment, the top electrode 610 is an Ag layer with a thickness of 60 nm. In other embodiments, the top electrode can be a stacked structure. For example, an Ag layer of about 30 nm is deposited over a-Si, and another metal (e.g., TiN/W) of about 30 nm can be deposited over the Ag layer. The thickness may vary depending on device size and implementation. Although silver is used in the present embodiment, it will be understood that the top electrode 610 can be formed from various other suitable metals, such as gold (Au), nickel (Ni), aluminum (Al), chromium (Cr), iron (Fe), manganese (Mn), tungsten (W), vanadium (V), cobalt (Co), and metal stacks.

The bottom electrode 606 is a boron-doped or other p-type polysilicon electrode and contacts a lower surface of the switching medium 608. The p-type polysilicon layer has a thickness of 20 nm, which may vary depending on implementation. In another embodiment, the bottom electrode 606 includes p+SiGe.

The p-type polysilicon of the bottom electrode 606 facilitates defect site formation in the dual switching layer to be controllable by enabling the tuning of the amorphous silicon deposition on the p-type polysilicon, so that the defect density in the filament region does not become too high. When a non-silicon-based material, e.g., Nickel or other metal, is used as a platform whereon the amorphous silicon is formed, the inventors have found that the filament formation was difficult to control due to the excess number of defect sites formed at the a-Si/metal interface. Furthermore, a-Si can react with the bottom metal electrode during the a-Si deposition, giving a-Si and metal alloy (silicide) at the interface. Accordingly, in addition to serving as an electrode, the p-type polysilicon serves as a platform that enables defect formation in the a-Si switching layer to be controllable.

The switching medium 608 provided between the top electrode 610 and the bottom electrode 606 includes amorphous silicon (a-Si) and exhibits a resistance that can be selectively set to various values and reset by applying appropriate electrical signals. The switching medium 608 has a thickness of 20 to 80 nm in the present embodiment. In other embodiments, the switching layer may have a different thickness depending on the device size and configuration. As used herein, the term "amorphous silicon" refers to amorphous silicon, in an amorphous phase, that includes small grains of crystalline silicon or amorphous polysilicon and that exhibits controllable resistance, a combination thereof, and the like.

In an embodiment, resistive memory cell 602 is configured to have resistance of no more than 10E4 Ohms in an ON state and greater than 10E8 Ohms in an OFF state. Resistive memory cell 602 may be configured to have different ON and OFF resistance values according to implementation. Resistive memory cell 602, in effect, behaves as a capacitor in an OFF state and as a resistor in an ON state.

Transistor 604 includes a semiconductor substrate 612, a source region 614, a drain region 616 separated from the source region 612 by a channel, a gate insulating layer (e.g., gate oxide) 618 provided over the channel, and a gate electrode 620 provided over the gate oxide 618. Transistor 604 uses a gate oxide instead of a tunnel oxide since tunneling electrons are not used to program or erase non-volatile memory device 600. Gate oxide 618 accordingly may be configured to have significantly less thickness than a tunnel oxide. Gate oxide 618 has a thickness of 50 Å or less, e.g., 20 to 30 Å or 10 to 15 Å, in an embodiment. The gate electrode 620 is configured to float electrically. In an embodiment, the gate electrode 620 shares the same polysilicon structure with bottom electrode 606 of resistive cell 602. In an embodiment, the gate insulating layer 618 is or includes silicon nitride or another insulating material.

In the present embodiment, a stack 622, including resistive memory cell 602 and gate oxide 618, has a height of no more than 80 nm, (e.g., about 65 nm, where Ag is 20 nm, a-Si is 20 nm, p-Si is 20 nm, and Ox is 5 nm). In another embodiment, stack 622 has a height of no more than 60 nm, (e.g., about 43 nm, where Ag is 15 nm, a-Si is 10 nm, p-Si is 15 nm, and Ox is 3 nm). Accordingly, stack 622 (or gate stack) has a significantly smaller height than a conventional flash memory cell.

The total capacitance for 600 is defined by: $1/C_T = 1/C_{602} + 1/C_{604}$, where $C_{602}$ refers to the capacitance of resistive memory cell 602 and $C_{604}$ refers to the capacitance of transistor 604. The total capacitance increases when resistive memory cell 602 is turned ON and decreases when the resistive memory cell 602 is turned OFF. The total capacitance, therefore, can be programmed to have different values by turning the resistive memory cell 602 ON or OFF. This programmed capacitance value may be retained for an extended time period according to the retention time of the resistive memory cell 602. In an embodiment, the programmable variable capacitor 400 may be programmed to have three or more capacitance values by integrating it with the resistive memory cell 602 that can be placed in three or more resistive states.

Figure 6B:
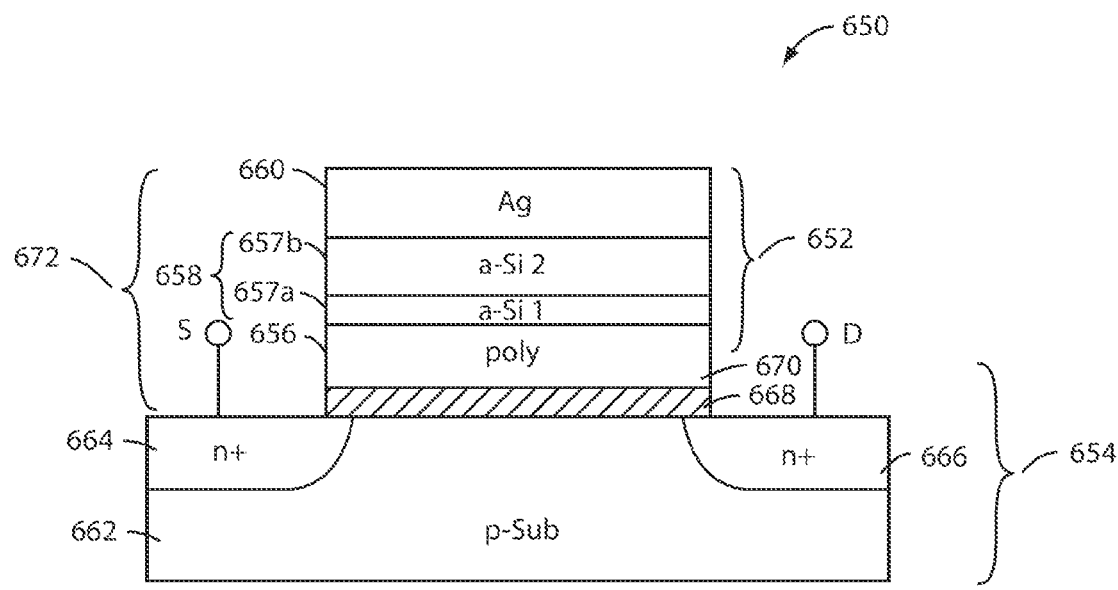
FIG. 6B illustrates a cross-sectional view of a resistive memory cell integrated with a transistor to define a non-volatile memory device according to another embodiment of the present invention.

FIG. 6B illustrates a non-volatile memory device 650 according to an embodiment of the present invention. Non-volatile memory device 650 includes a resistive memory cell 652 and a transistor 654 and is a type of programmable variable capacitor. Non-volatile memory device 650 does not require a tunnel oxide for the transistor 604 since the resistive state of the resistive memory cell 652 is used to store information. Non-volatile memory device 650 also does not require a high gate structure since its program voltage does not depend on the coupling ratio between the control gate and the floating gate as in the flash memory cell.

Resistive memory cell 652 includes a bottom electrode 656, a dual switching layer 658, and a top electrode 660 according an embodiment. In an embodiment, the bottom electrode 656, the dual switching layer 658, and the top electrode 660 have thicknesses of 20 nm, 20 nm, and 20 nm, respectively. Resistive memory cell 652 can be placed in a plurality of resistive states, e.g., ON or OFF states, by applying electrical signals to the electrodes. The electrical signal may be current-based or voltage-based.

Resistive memory cell 652 is amorphous-silicon-based RRAM and uses amorphous silicon as dual switching layer 656. The resistance of the switching layer 656 changes according to formation or retrieval of a conductive filament inside the a-Si switching layer according to voltage or current applied to the electrodes.

The top electrode 660 includes silver (Ag) as the source of filament-forming metal ions in the switching layer 656. In an embodiment, the top electrode 660 is an Ag layer with a thickness of 150 nm. In other embodiments, the top electrode can be a stacked structure. For example, an Ag layer of about 50 nm is deposited over a-Si, and another metal (e.g., TiN/W) of about 100 nm can be deposited over the Ag layer. The thickness may vary depending on the device size and implementation. Although silver is used in the present embodiment, it will be understood that the top electrode can be formed from various other suitable metals, such as gold (Au), nickel (Ni), aluminum (Al), chromium (Cr), iron (Fe), manganese (Mn), tungsten (W), vanadium (V), cobalt (Co) or metal stacks.

The bottom electrode 656 is a boron-doped or other p-type polysilicon electrode and contacts a lower surface of the a-Si switching layer 657a. In an embodiment, the bottom electrode 656 includes a metal layer (not shown), as described in U.S. patent application Ser. No. 12/582,086, filed on Oct. 20, 2009, which is assigned to the common assignee and is incorporated by reference in its entirety. The p-type polysilicon layer has a thickness of 30 nm, which may vary depending on implementation.

The p-type polysilicon of the bottom electrode 656 facilitates defect site formation in the dual switching layer 658 and controls defect site formation by enabling the tuning of the amorphous silicon deposition on the p-type polysilicon, so that the defect density in the filament region does not become too high.

The dual switching layer 658, provided between the top electrode 660 and the bottom electrode 656, includes amorphous silicon (a-Si) and exhibits a resistance that can be selectively set to various values and reset by applying appropriate electrical signals. The dual switching layer 658 includes a first a-Si structure 657a having a thickness of 2 to 15 nm and a second a-Si structure 657b having a thickness of 20 to 80 nm. The thicknesses of these amorphous silicon structures vary depending on device size and configuration.

The first and second a-Si structures 657a and 657b respectively, have different defect densities. The first a-Si structure 657a contacting the p-type polysilicon layer of bottom electrode 656 is made to have a higher defect density than the second a-Si structure 657b in order to facilitate the filament formation therein and increase the retention time of the device. Although the present embodiment illustrates the dual switching layer 658 as having two different types of layers, the dual switching layer 658 may have more than two different types of layers in other embodiments or it may have a single layer with a defect density gradient.

In an embodiment, resistive memory cell 652 is configured to have resistance of no more than 10E4 Ohms in an ON state and greater than 10E8 Ohms in an OFF state. Resistive memory cell 652 may be configured to have different ON and OFF resistance values according to implementation. Resistive memory cell 652 in effect behaves as a capacitor in an OFF state and as a resistor in an ON state.

Transistor 654 includes a semiconductor substrate 662, a source region 664, a drain region 666 separated from the source region 664 by a channel, a gate oxide 668 provided over the channel, and a gate electrode 670 provided over the gate oxide 658. The semiconductor substrate 662 may be a silicon substrate or a compound substrate of a III-V or II-VI type. In an embodiment, the substrate 662 is made material that is not semiconductor, e.g., plastic.

Transistor 654 uses a gate oxide instead of a tunnel oxide since tunneling electrons are not used to program or erase non-volatile memory device 650. Gate oxide 658 accordingly may be configured to have significantly less thickness than a tunnel oxide used in floating gate structures. Gate oxide 658 has a thickness of 50 Å or less, e.g., 20 to 30 Å or 10 to 20 Å, in an embodiment. The gate electrode 670 is configured to float electrically. In an embodiment, the gate electrode 670 shares the same polysilicon structure with the bottom electrode 656 of resistive cell 652.

In the present embodiment, a stack 672, including resistive memory cell 652 and the gate oxide 658, has a height of no more than 80 nm, (e.g., about 65 nm, where Ag is 20 nm, a-Si is 20 nm, p-Si is 20 nm, and Ox is 5 nm). In another embodiment, stack 672 has a height of about 40 nm. Stack 672 (or gate stack), accordingly, has a significantly smaller height than a conventional flash memory cell.

The total capacitance for non-volatile memory device 650 is defined by: $1/C_T = 1/C_{652} + 1/C_{654}$, where $C_{652}$ refers to the capacitance of resistive memory cell 652 and $C_{654}$ refers to the capacitance of transistor 654. The total capacitance increases when resistive memory cell 652 is turned ON and decreases when the resistive memory cell 652 is turned OFF. The total capacitance, therefore, can be programmed to have different values by turning the resistive memory cell ON or OFF. This programmed capacitance value may be retained for an extended time period according to the retention time of resistive memory cell 652. In an embodiment, non-volatile memory device 650 may be programmed to have three or more capacitance values by integrating it with resistive memory cell 652 that can be placed in three or more resistive states.

Figure 7A:
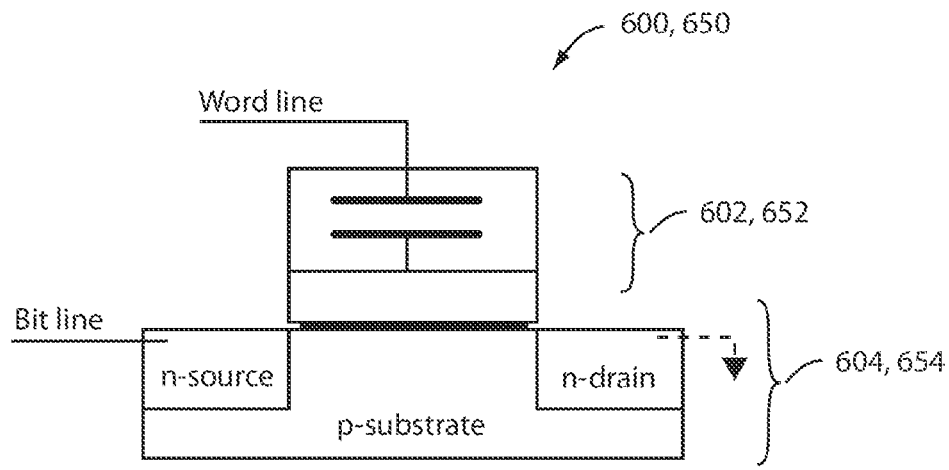
FIGS. 7A and 7B illustrate a non-volatile memory device, and an equivalent circuit thereof, when the resistive memory cell of the non-volatile memory device is in an OFF state according an embodiment of the present invention.
Figure 7B:
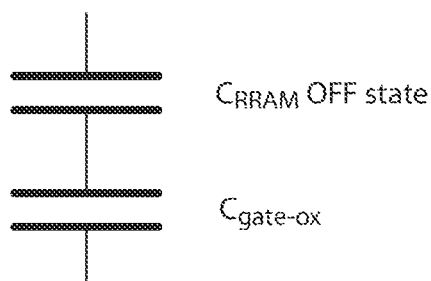

FIGS. 7A and 7B illustrate the non-volatile memory devices 600 and 650, and an equivalent circuit thereof when the resistive memory cell of the non-volatile memory device is in an OFF state according an embodiment of the present invention. Device 600 includes resistive memory cell 602 and transistor 604. Resistive memory cell 602 is in a high resistive state, or OFF state, and functions primarily as a capacitor. Accordingly, device 600 is provided with a low total capacitance and transistor 604 is turned OFF.

Figure 8A:
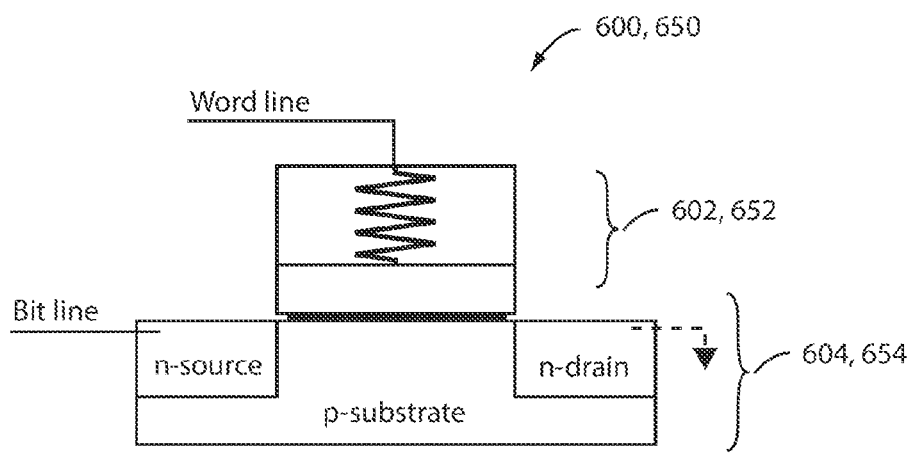
FIGS. 8A and 8B illustrate a non-volatile memory device, and an equivalent circuit thereof, when the resistive memory cell of the non-volatile memory device is in an ON state according an embodiment of the present invention.
Figure 8B:
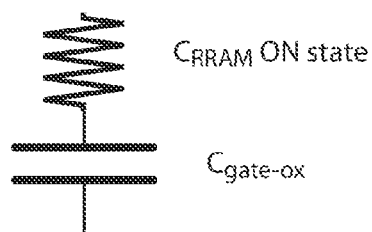

FIGS. 8A and 8B illustrate the non-volatile memory device 600, 650, and an equivalent circuit thereof, when the resistive memory cell of the non-volatile memory device is in an ON state according an embodiment of the present invention. A program voltage $V_{pth}$ (e.g., 3 volts or less) is applied to the top electrode of device 600 (or device 650) to turn ON resistive memory cell 602. Resistive memory cell 602 is placed in a lower resistive state and functions primarily as a resistor. Device 600 is provided with a high total capacitance and transistor 604 is turned ON. Accordingly, the non-volatile memory device 600, 650 may be used effectively to store information. Non-volatile memory device 600, 650 requires a gate stack that is significantly smaller, and a program/erase voltage is significantly lower, than the conventional flash memory cell. Non-volatile memory device 600, 650 may be implemented in a various cell array structures, e.g., NAND, NOR, and crossbar, to provide an ultra-high density non-volatile memory device.

Figure 9:
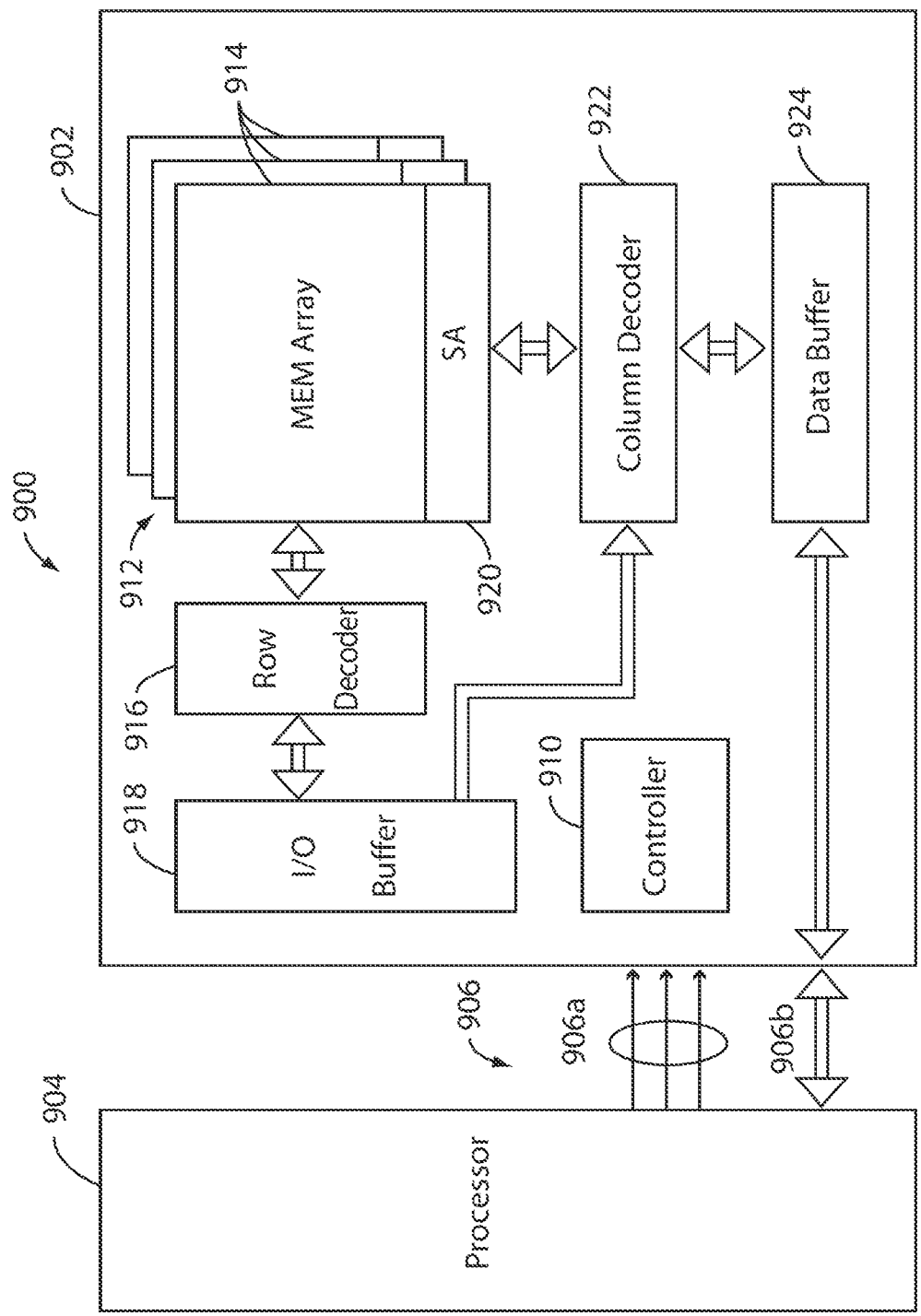
FIG. 9 illustrates a block diagram of a system including a flash memory device that incorporates RRAM cells according to an embodiment of the present invention.

FIG. 9 illustrates a block diagram of a system 900 including a flash memory device 902 incorporating RRAM cells according to an embodiment of the present invention. Examples of RRAM cells include the cells illustrated in FIG. 1. The flash memory device 902 stores information in an array of memory cells even when power is not applied. Typically, these memory cells are implemented using floating-gate transistors where the information is stored by trapping electrons in the floating gates. In the present embodiment, the memory cell uses a conventional transistor with a RRAM coupled to the gate of the transistor instead of the floating gate to store information (see, e.g., FIGS. 6A and 6B).

Flash memory devices are commonly categorized as either a NAND device or a NOR device. In NOR devices, each cell has one end connected directly to the ground, and the other end connected directly to a bit line. A NAND device has memory cells (or transistors) that are connected in series between a common source line and a common drain line.

In an embodiment, the flash memory device 902 is a NAND memory device. The NAND flash memory device 902 is connected to a host, e.g., a processor 904, via a bus system 906. The processor 904 uses the bus system 906 to read and write to the flash memory device 902. The bus system 906 may include a control bus 906a to send control signals and an address/data bus 906b to send and receive address and data.

The NAND flash memory device 902 includes a controller 910 for managing memory arrays 912, updating control registers (not shown), and controlling other internal operations. The memory arrays 912 contain a plurality of memory banks 914 or segments. Each of the memory banks 914 are organized logically into a series of erase blocks. Memory access addresses are received on the address/data bus 906b and are divided into row and column address components.

During a read operation, the row address is latched and decoded by a row decoder 916, which selects and activates a row page of memory cells and the other memory cells in their associated strings across a selected memory bank and communicates with I/O buffers 918.

The bit values encoded in the output of the selected row of memory cells are connected to a global bit line (not shown) and detected by sense amplifiers 920 associated with the memory bank. The column address for the access is latched and decoded by the column decoder 922, which communicates with I/O buffers 918. The column decoder 922 receives the desired data from the sense amplifier 920 and outputs them to the data buffer 924 for transfer from the memory device 902 through the address/data bus 906b.

During a write operation, the row decoder 916 selects the row page and the column decoder 922 selects the sense amplifier 920. Data values to be written are provided by the data buffer 924 to the selected sense amplifier 920 and are then written to the selected memory cells of the memory array 912. The written memory cells are then reselected by the row decoder 916, the column decoder 922, and the sense amplifiers 920 so that they can be read to verify that the correct values have been programmed into the selected memory cells. The NAND flash memory device 902 and its operations described above are exemplary only. In other embodiments, the NAND flash memory device 902 may include different components and/or perform different steps to execute the read and write operations.

Figure 10:
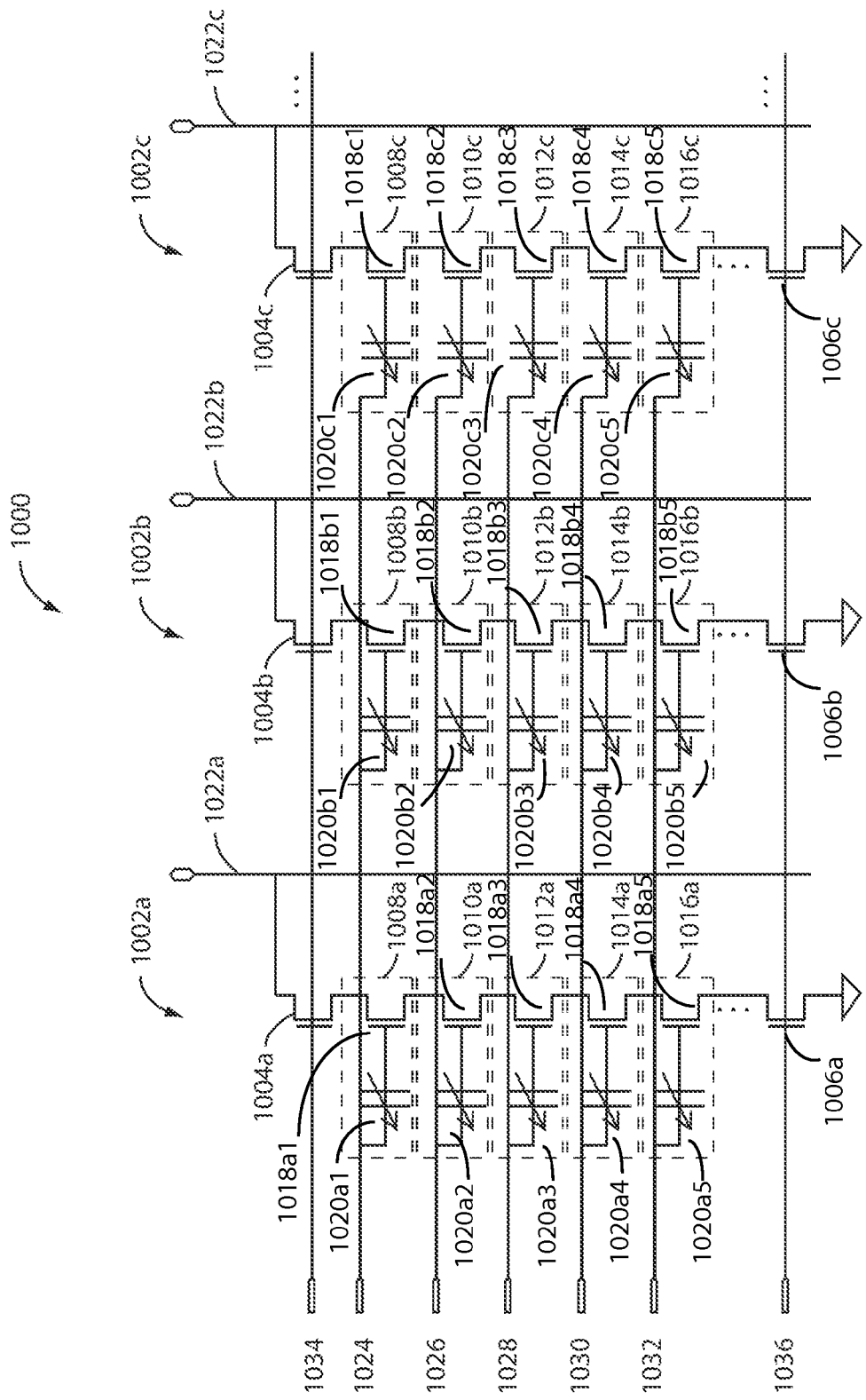
FIG. 10 illustrates a schematic diagram of a NAND memory array (or a memory bank) according to an embodiment of the present invention.

FIG. 10 illustrates a schematic diagram of a NAND memory array (or a memory bank) 1000 according to an embodiment of the present invention. As will be understood by those skilled in the art, the memory array 1000 shows only a portion of the memory array for illustrative convenience.

The NAND memory array 1000 includes a plurality of cell strings 1002a, 1002b, and 1002c. Each memory cell string includes a plurality of transistors that are connected drain to source in series. Each string has a drain select transistor 1004a, 1004b, or 1004c as the first transistor and a source select transistor 1006a, 1006b, or 1006c as the last transistor in the string. A plurality of memory cells 1008, 1010, 1012, 1014 are provided between the drain select and the source select transistors. Each memory cell comprises a transistor 1018 and a RRAM 1020. Memory cells 1008, 1010, 1012, and 1014 do not use floating gates to store information, unlike the conventional flash memory devices. Accordingly, memory cells 1008, 1010, 1012, and 1014 do not need to use the tunnel oxide, which requires a thickness of approximately 70 Å or greater. As a result, and the height of the gate structure does not need to be as high as in the conventional flash memory devices.

The NAND memory array 1000 also includes a plurality of bit lines 1022a, 1022b, and 1022c, a plurality of word lines 1024 to 1032, a drain select line 1034 and a source select line 1036. The drains of the drain select transistors 1004a, 1004b, and 1004c are connected to the bit lines 1022a, 1022b, and 1022c, respectively. These bit lines are also referred to as common bit lines since each of them functions as a bit line for a string of transistors. The drain select line 1034 is connected to the gates of the drain select transistors 1004a, 1004b, and 1004c, and works in cooperation with the bit lines to control the current flow or the voltage being applied to the drains of the transistors in the strings. The sources of the source select transistors 1006a, 1006b, and 1006c are connected to the ground. The source select line 1036 is connected to the gates of the source select transistors 1006a, 1006b, and 1006c, and control the current flow and the voltage level of the strings.

In an embodiment, the memory cells 1008, 1010, 1012, and 1014 use the RRAM cells as a medium for storing information instead of the floating gates. Significantly less voltage is required to program or erase the memory cells 1008, 1010, 1012, and 1014 than that required for conventional flash memory cells, which use floating gates. For example, a conventional flash memory device requires 15 volts or greater to program or erase the memory cells. A high potential difference is required to cause the electrons to tunnel through the tunnel oxide provided between the floating gate and the channel. However, the flash memory device of the present embodiment requires 10 volts or less, e.g., 5 volts, to program or erase the memory cells since the RRAM requires 5 volts or less to change their resistive states. Moreover, since tunneling is not used, the memory cells 1008, 1010, 1012, and 1014 can use gate oxide that is significantly thinner than the tunnel oxide.

Figure 11:
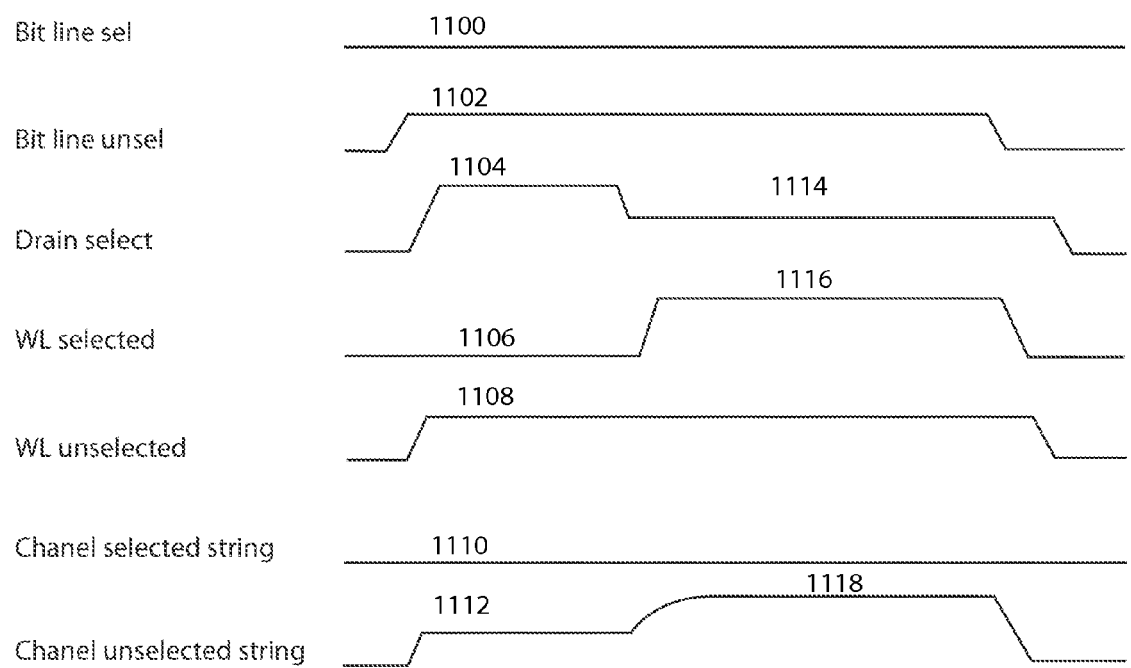
FIG. 11 illustrates timing diagrams associated with a write operation of the NAND memory array according to an embodiment of the present invention.

FIG. 11 illustrates timing diagrams associated with a write operation of the NAND memory array 1002 according to an embodiment of the present invention. In an example provided herein, the memory cell 1012a is being programmed. The bit line 1022a is selected by grounding it (numeral 1100). The bit lines 1022b and 1022c that are not selected are applied 1.5 volt (numeral 1102). The drain select line 1034 applies 3 volts to the gate of the drain select transistors 1004a, 1004b, and 1004c during a pre-charge step (numeral 1104) and these transistors are turned on. The word line 1028, coupled to the selected memory cell 1012a, is grounded during the pre-charge step (numeral 1106). The word lines 1024, 1026, 1030, and 1032 apply 3 volts to the unselected memory cells during the pre-charge step as well as during the write step (numeral 1108). As a result, the channel of the selected string 1002a remains at 0 volt (numeral 1110), i.e., the voltage of the selected bit line 1022a, during the pre-charge step. The channels of the unselected strings 1002b and 1002c rise to 1.5 volt during the pre-charge step (numeral 1112).

During the write step, the drain select line 1034 applies 1.5 volt to the gate of the drain select transistors (numeral 1114), thereby turning off the drain select transistors. The selected word line 1028 applies 5 volts (numeral 1116) to program the memory cell 1012a. The RRAM cell of the memory cell 1012a is turned ON or converted to a low resistivity state by the program voltage of 5 volts. The transistor of the memory cell 1012a is also turned on by applying about 5 volts to its gate, thereby turning on all the transistors in the selected string 1002a.

The selected word line 1028 also applies 5 volts to the memory cells 1014b and 1014c. These memory cells, however, are not turned on since the potentials of the channels of these memory cells are increased to 3 to 5 volts (numeral 1118) during the write step as the word line 1028 applies the program voltage of 5 volts to the memory cells 1014b and 1014c. Accordingly, the transistors of these memory cells remain turned off. The sense amplifier (see numeral 920 of FIG. 9) senses the program state of the strings 1002a, 1002b, and 1002c based on the current flow or the voltage levels of these strings.

A number of embodiments have been described. Nevertheless, it will be understood that various modifications may be made without departing from the spirit and scope of the present invention. For example, the ordering of layers on the substrate could be reversed, where the top electrode is provided below the bottom electrode depending on implementation. Also, the switching medium may be made of metal oxide or materials other than amorphous silicon. Accordingly, other embodiments are within the scope of the following claims.

What is claimed is:

1. A non-volatile memory device, comprising:
   a first select transistor;
   a second select transistor;
   a first string of first memory cells provided between the first and second select transistors, each first memory cell having a first resistive memory cell and a first transistor, the first resistive memory cell being in series with a gate of the first transistor;
   a first bit line coupled to a drain of the first select transistor; and
   a plurality of word lines, each word line being coupled to one of the first memory cells.

2. The non-volatile memory device of claim 1, further comprising:
   a drain select line coupled to a gate of the first select transistor; and
   a source select line coupled to a gate of the second select transistor.

3. The non-volatile memory device of claim 1, wherein the resistive memory cell is a two-terminal switching device.

4. The non-volatile memory device of claim 3, wherein the resistive memory cell includes two electrodes and a switching medium provided therebetweeen.

5. The non-volatile memory device of claim 4, wherein the switching medium including amorphous silicon.

6. The non-volatile memory device of claim 1, further comprising:
   a third select transistor;
   a fourth select transistor;
   a second string of second memory cells provided between the third and fourth select transistors, each second memory cell having a second resistive memory cell and a second transistor, the second resistive memory cell being in series with a gate of the second transistor; and
   a second bit line coupled to a drain of the third select transistor,
   wherein each of the plurality of word lines is coupled to one of the second memory cells.

7. The non-volatile memory device of claim 6, wherein the device is a NAND flash memory device.

8. The non-volatile memory device of claim 1, wherein each resistive memory cell includes a first electrode, a switching medium, and a second electrode, and
   wherein each transistor includes a gate electrode, a gate oxide, a source region, a drain region, and a channel between the source and drain regions.

9. The non-volatile memory device of claim 8, wherein the second electrode of the resistive memory cell and the gate electrode of the transistor are in contact with each other.

10. The non-volatile memory device of claim 9, wherein the second electrode of the resistive memory cell and the gate electrode of the transistor share the same conductive structure.

11. The non-volatile memory device of claim 9, wherein the second electrode of the resistive memory cell and the gate electrode of the transistor share the same conductive structure, the same conductive structure being a polysilicon layer.

12. The non-volatile memory device of claim 8, wherein the first electrode includes silver and the switching medium including amorphous silicon.

13. The non-volatile memory device of claim 8, wherein the gate oxide has a thickness of 50 Å or less.

14. The non-volatile memory device of claim 8, wherein the gate oxide has a thickness of 20-30 Å.

15. The non-volatile memory device of claim 8, wherein the gate oxide has a thickness of 20 Å or less.

16. The non-volatile memory device of claim 8, wherein the gate oxide has a thickness of 20-30 Å.

17. The non-volatile memory device of claim 1, further comprising:
   a first memory array; and
   a second memory array stacked on top of the first memory array,
   wherein the first memory array comprises the first select transistor, the second select transistor, the first string of first memory cells, the first bit line, and the plurality of word lines, and
   wherein the second memory array mirrors the configuration of the first array of memory cells.

18. The non-volatile memory device of claim 1, further comprising:
   a third select transistor;
   a fourth select transistor;
   a second string of second memory cells provided between the third and fourth select transistors, each second memory cell having a second resistive memory cell and a second transistor, the second resistive memory cell being in series with a gate of the second transistor; and
   a second bit line coupled to a drain of the third select transistor,
   wherein each of the plurality of word lines is coupled to one of the second memory cells, and
   wherein a source of the second select transistor and a source of the fourth select transistor are coupled to a ground potential.

19. The non-volatile memory device of claim 18, further comprising:
   a drain select line coupled to a gate of the first select transistor and a gate of the third select transistor and configured to turn on or turn off the first and third select transistors; and
   a source select line coupled to a gate of the second select transistor and a gate of the fourth select transistor and configured to turn on or turn off the second and fourth select transistors.

20. The non-volatile memory device of claim 1, wherein the first resistive memory cell includes first and second electrodes and a switching medium provided between the first and second electrodes, and
   wherein the second electrode of the first resistive memory cell is the gate of the first transistor.

21. The non-volatile memory device of claim 20, wherein the first electrode includes silver, the switching medium includes amorphous silicon, and the second electrode includes polysilicon.

22. The non-volatile memory device of claim 21, wherein the second electrode includes P+ polysilicon or P+SiGe.

23. A non-volatile memory device, comprising:
   a first string of first memory cells, each first memory cell having a first resistive memory cell and a first transistor, the first resistive memory cell being in series with a gate of the first transistor;
   a first bit line coupled to the first string;

a second string of second memory cells, each second memory cell having a second resistive memory cell and a second transistor, the second resistive memory cell being in series with a gate of the second transistor;

a second bit line coupled to the second sting; and a plurality of word lines, each word line being coupled to one of the first memory cells in the first string and one of the second memory cells in the second string.

24. The non-volatile memory device 23, wherein each resistive memory cell is connected in series to a gate of the corresponding transistor.

25. The non-volatile memory device of claim 23, wherein each resistive memory cell includes a first electrode, a switching medium, and a second electrode, wherein each transistor includes a gate electrode, a gate oxide, a source region, a drain region and a channel, wherein the second electrode and the gate electrode share a conductive material, and wherein the second electrode is provided over a gate insulating layer.

26. The non-volatile memory device 23, wherein each resistive memory cell is configured to store more than a single bit of information.

* * * * *